(12) United States Patent
Berkhout

(10) Patent No.: US 6,384,678 B2
(45) Date of Patent: May 7, 2002

(54) SILENT START

(75) Inventor: Marco Berkhout, Nijmegen (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/864,135

(22) Filed: May 24, 2001

(30) Foreign Application Priority Data

May 25, 2000 (EP) .............................. 00201827

(51) Int. Cl.[7] ................................................ H03F 3/38
(52) U.S. Cl. ...................... 330/10; 330/207 A
(58) Field of Search .............................. 330/10, 207 A, 330/251

(56) References Cited

U.S. PATENT DOCUMENTS 5,160,896 A  * 11/1992  McCorkle .................... 330/251
5,596,648 A  *  1/1997  Fast .............................. 381/77
5,805,020 A     9/1998  Danz et al. .................... 330/10
6,300,825 B1 * 10/2001  Dijkmans et al. ............. 330/10

FOREIGN PATENT DOCUMENTS

EP         0817371 A1    1/1998

* cited by examiner

Primary Examiner—Robert Pascal
Assistant Examiner—Henry Choe
(74) Attorney, Agent, or Firm—Steven R. Biren

(57) ABSTRACT

The invention relates to a push-pull amplifier having a silent start circuit. To overcome the problem of noise during start up the amplifier of the invention comprises a silent start circuit, which decides the "perfect" moment to start the power switches without the known start-up noise.

3 Claims, 4 Drawing Sheets

SILENT START

BACKGROUND OF THE INVENTION

The invention relates to a push-pull amplifier as described in the preamble of claim 1.

From the U.S. Pat. No. 5,805,020 a silent start Class D amplifier is known wherein start-up noise is corrected by adding an analog switch to the integrator circuit. In an alternate embodiment a silent start switch connects a variable resistance to a comparator input. The resistance gradually increases to overcome start-up noise.

A disadvantage of this known silent start Class D amplifier is that activating the switching unit is done at a completely arbitrary moment.

SUMMARY OF THE INVENTION

It is an object of the invention to provide a push-pull amplifier and a silent start circuit, which do not have the disadvantages of the known amplifier and silent start circuit. To this end, a push-pull amplifier comprises the features of claim 1. The invention provides the possibility to firstly bring the loop approximately at the required level and secondly to wait with the switching on moment till the moment at which the start up noise is as small as possible.

Embodiments of the invention are described in the dependent claims.

Herewith a cross-reference is made to the following co-pending applications of the same applicant and of the same date:

"Carrousel handshake" applicant's ref. No. ID603908, application Ser. No. 0,201,818.2
"Level shifter" applicant's ref. No. ID604680, application Ser. No. 0,201,826.5
"PWM limiter" applicant's ref. No. ID604682, application Ser. No. 0,201,828.1
"Demodulation filter" applicant's ref. No. ID604683, application Ser. No. 0,201,829.9.

BRIEF DESCRIPTION OF THE DRAWINGS

These and other aspects of the invention will be apparent from and elucidated with reference to the examples described hereinafter. Herein shows FIG. 1 schematically an example of a push-pull amplifier, FIG. 2 schematically the equivalent circuit during start-up, FIG. 3 the optimal start-up moments, FIG. 4 an example of the silent loop circuit, FIG. 5 an example of the comparator input signals in silent mode, FIG. 6 a circuit with the silent start circuits, and FIG. 7 an example of the silent start logic implementation.

DETAILED DESCRIPTION OF PREFERRED EMBODIMENTS

Figure 1:
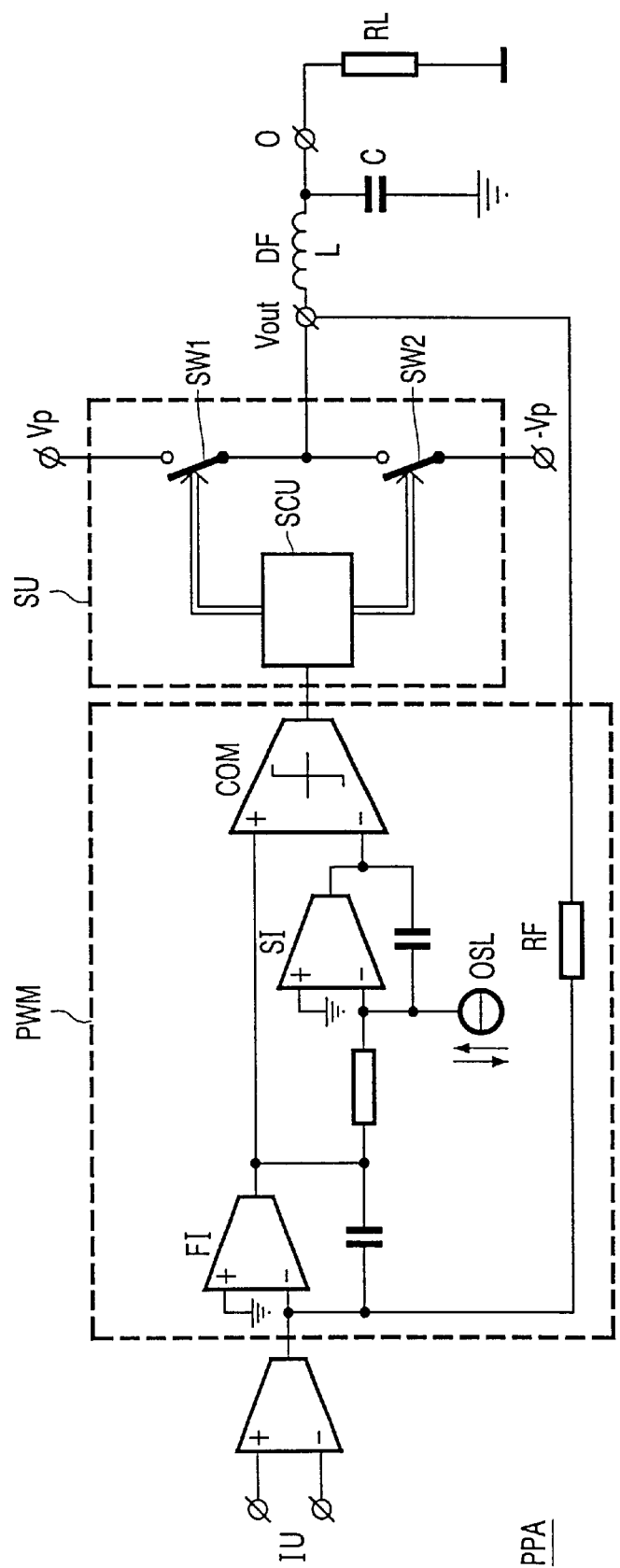

FIG. 1 shows block-schematic an example of a push-pull amplifier PPA according to the invention. Via an input unit IU the amplifier receives the input signal. The input unit IU is coupled to a pulse-width modulator PWM, which is coupled with an output to a switching unit SU. The switching unit supplies an output signal via a demodulation filter DF to the output 0 of the amplifier. The pulse-width modulator PWM is coupled in a feedback loop with a feedback element RF which is coupled with one side to the output of the switching unit SU and with the other side to the input of the pulse-width modulator. The pulse-width modulator further comprises a first integrator FI and a second integrator SI and a comparator COM, the input of the first integrator is coupled to the output of the input unit IU and the input of the second integrator is coupled to an output of the first integrator FI and also coupled to an oscillator OSC.

The switching unit SU comprises a switch control unit SCU and a first and second switch SW1, SW2, respectively. The demodulation filter DF is in this example shown as an inductance L and a capacitance C can be a second order low-pass demodulation filter, or higher order demodulation filter.

Instead of using two integrators it is also possible to use only one integrator. At the inverting input of the comparator for example a saw tooth signal can then be supplied.

A common problem with audio amplifiers is the occurrence of noises in the loudspeaker when the amplifier is switched on.

Considerable design effort is usually needed to reduce this start-up noise or 'plop'. In a Class D feedback amplifier two mechanisms contribute to start-up noise.

First, when the amplifier is started, the initial condition of the integrators (FI, SI see FIG. 1) in the loop is undefined and usually not even near the steady state region. Therefore, the loop needs some time to settle. Since the switching unit is active during this settling this can lead to audible noises in the loudspeaker. Ideally, the output of the amplifier produces a 50% dutycycle squarewave signal directly after start-up.

Second, before start-up the output of the switching unit is usually in a high-ohmic state to prevent DC current in the loudspeaker. At a certain moment in time the output starts switching. Even if the amplifier is able to produce a perfect pulse width modulated signal with 50% dutycycle directly after start-up this always results in a response in the loudspeaker because the demodulation filter needs to settle.

Assuming that the amplifier is able to produce the desired 50% dutycycle squarewave signal directly, the only degree of freedom that remains is the phase at which the signal is started.

Figure 2:
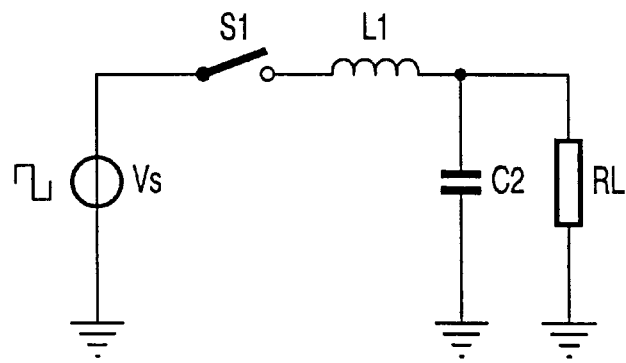

FIG. 2 shows schematically the equivalent circuit during start up.

Figure 3:
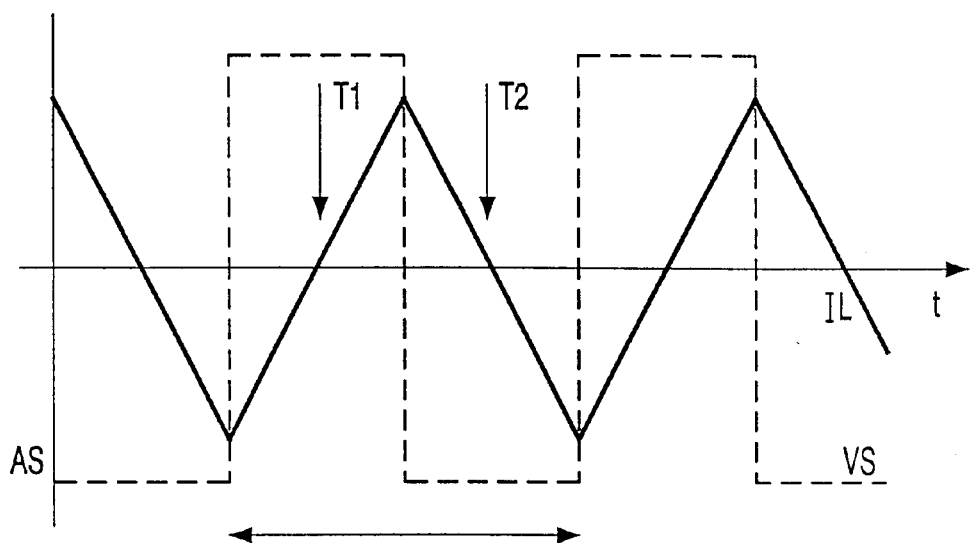

In order to determine the optimal starting phase consider the situation shown in FIG. 3. Here the voltage source $V_s$ generates a square wave with amplitude $A_s$ and a frequency $\omega_s$ much higher than the cut-off frequency $\omega_o$ of the filter. Initially, switch $S_l$ is open and no energy is stored in the filter, i.e. both inductor current $I_L$ and capacitor voltage $V_c$ are zero.

After switch $S_l$ is closed and the filter has settled to steady state the inductor current $I_L$ and capacitor voltage $V_c$ change periodically. The energy stored in the inductor and capacitor are expressed as:

$$E_L = \tfrac{1}{2} I_L^2 \cdot L$$

$$E_C = \tfrac{1}{2} V_C^2 \cdot C$$

In steady state the total energy stored in the filter also changes periodically. The optimal time to close the switch is in the phase of the source signal where the stored energy reaches the minimal value.

In the stopband the energy stored in the components in a LC-filter decreases rapidly from source to load and is dominated by the element nearest to the source to load and is dominated by the element nearest to the source. In the second order filter shown in FIG. 2. the total stored energy is dominated by the inductor. Therefore the stored energy is nearly minimal when the inductor current $I_L$ is zero. The source signal $V_S$ and inductor current $I_L$ during steady state are shown in FIG. 3.

As can be seen in FIG. 3 the inductor current $I_L$ becomes zero twice each in each period of the source. Consequently, the optimal start-up moment is at ¼ or ¾ of the period. For the output response both moments are equivalent. However, since in is preferred that the output is switched to the lowside first in order to charge the bootstrap. Therefore, the optimal phase to start switching is at ¾ period. This derivation is also valid for higher order demodulation filters.

Now two problems have to be solved to realize the optimal startup behavior. First, the control loop needs to be in steady state before the output is enabled and second the output has to be enabled at the optimal moment.

The first problem can easily be solved by using a secondary feedback loop. As explained earlier, the signal that is fed back to the virtual ground of the first integrator in the loop is a squarewave current with amplitude $I_{fb}=V_p/R_I$. This current can be emulated by a switched current source that is controlled by the same comparator output as used to control the switching unit.

Figure 4:
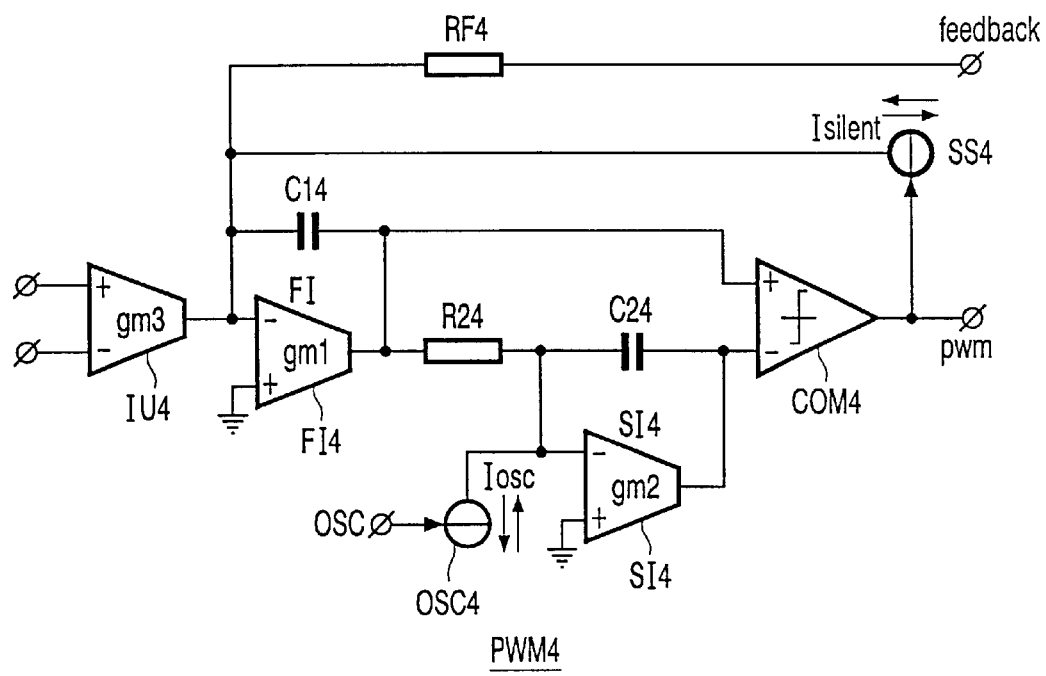

This results in the system shown in FIG. 4. The pulse width modulator PWM4 operates as follows. As long as the switching unit (SU, see FIG. 1) is not enabled, no current is fed back through resistor RI. In this case the switched current source (SCU, see FIG. 1) is enabled and a current $+I_{silent}$ or $-I_{silent}$ is fed back to the virtual ground. As far as the loop is concerned this situation is equivalent to the situation where the switching unit is enabled and the switched current source SS4 is disabled as long as $I_{silent}$ equals $I_{fb}$. Consequently, the loop converges to steady state. After steady state is reached, which is within a few clockcycles, the switched current source is disabled and the switching unit is enabled simultaneously. This secondary feedback configuration is called the silent loop since it operates only if the switching unit is disabled.

The second problem is to determine the optimal moment to switch between the silent loop and the main loop. For this purpose the internal signals can be exploited. Since the silent loop is equivalent to the main loop the internal signals in silent mode are identical to those in normal mode. These signals are shown in FIG. 5.

Figure 5:
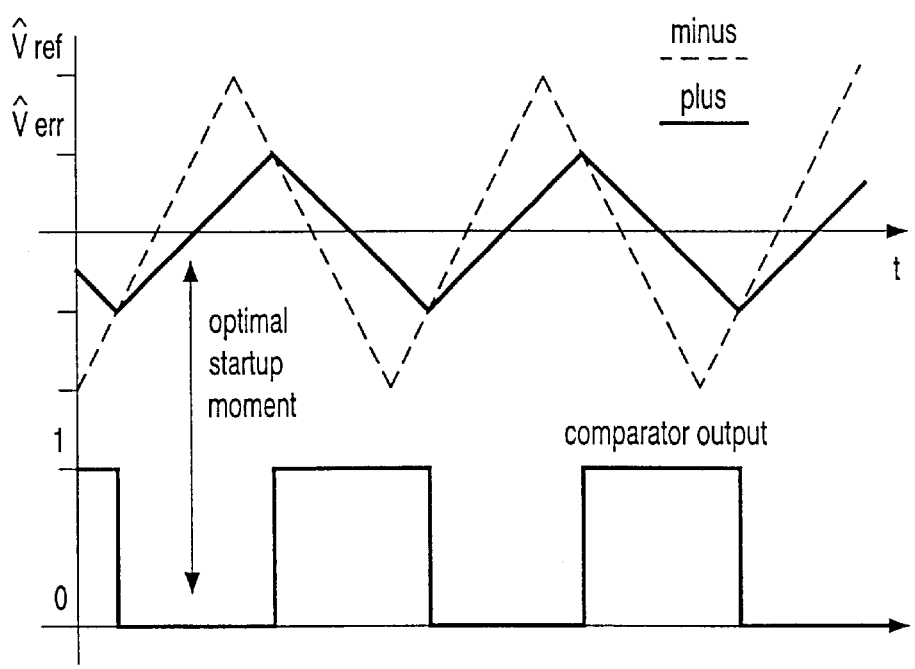
Figure 6:
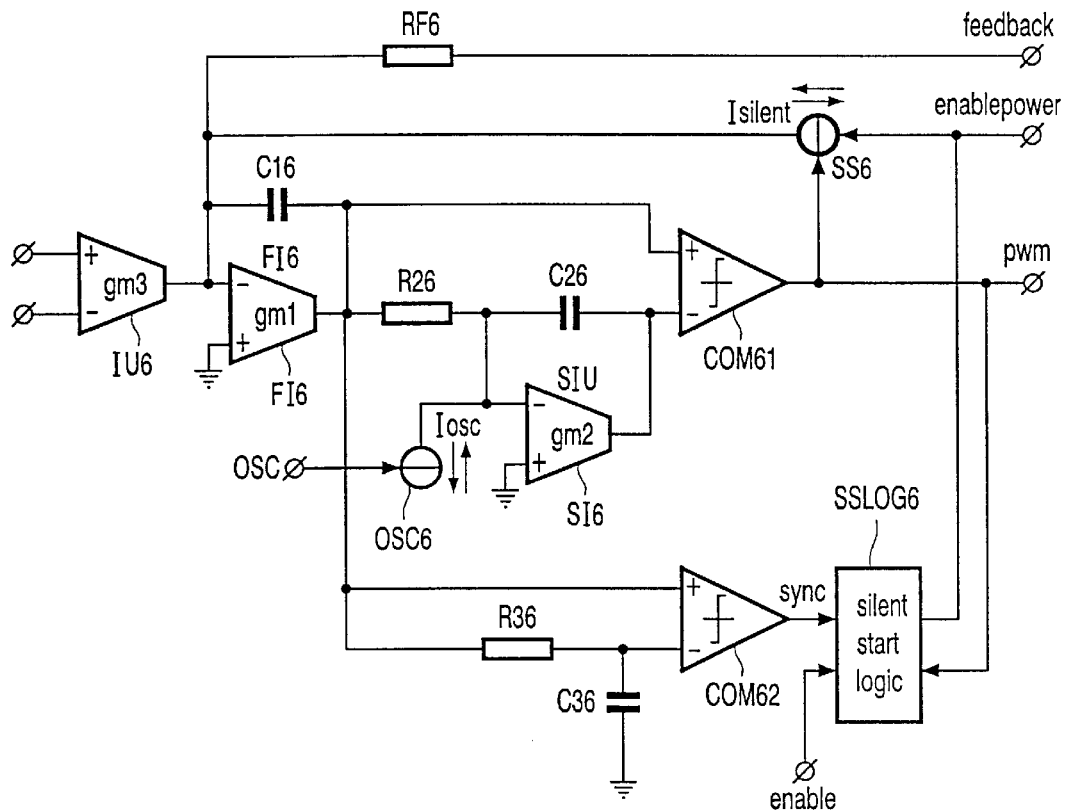

In FIG. 5 can be seen that the optimal moment to enable the switching unit is when the plus signal crosses zero. This moment can easily be detected by a second comparator COM62 as shown in FIG. 6. The output signal of this comparator is called the sync signal. In order to have optimal startup behavior the signal that enables the switching unit has to be synchronized with the rising edge of the sync signal. For this purpose a simple logic circuit SSLOG6 can be used.

Note that the inverting input of the second compurgator is not connected to the signal ground but to a low pass filtered version of the plus signal. This has been done to compensate for offset errors which cause a DC component to the internal signals which influences the timing.

The signal path contains two switched current sources. The function of these sources is to either sink or source a current of constant magnitude depending on a logic control signal.

Figure 7:
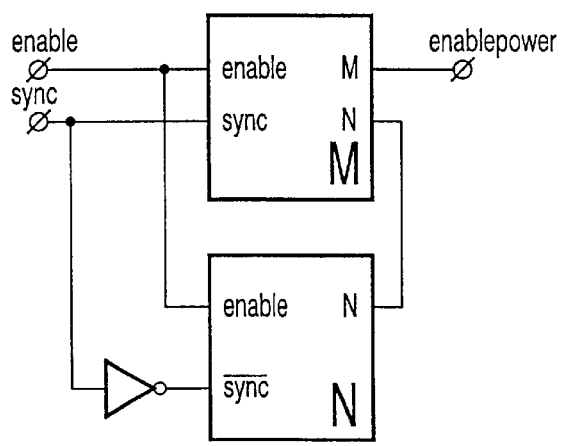

FIG. 7 shows an implementation of the silent start logic circuit SSLOG7.

It is to be noticed that above the invention has been described on the basis of an example but that the man skilled in the art is well aware of amendments without departing from the invention.

What is claimed is:

1. Push-pull amplifier having an input for receiving an input signal and an output for supplying an output signal which push-pull amplifier comprises a pulse width modulator comprising at least two integrators, comparator and a feedback element, a switching unit having at least two switches coupled to the output of the pulse width modulator and a demodulator filter coupled to the output of the switching unit characterized in that the pulse width modulator comprises a silent start circuit for obtaining a start-up of the amplifier without start-up noise, which silent start circuit having a sudden loop for disabling the switching unit during start-up.

2. A push-pull amplifier as claimed in claim 1, characterized in that the push-pull amplifier is a class D amplifier.

3. Silent start circuit for use in a push-pull amplifier as claimed in claim 1.

* * * * *